US00RE37223E

(19) United States
(12) Reissued Patent
Bose et al.

(10) Patent Number: US RE37,223 E
(45) Date of Reissued Patent: Jun. 12, 2001

(54) DYNAMIC EQUALIZING

(75) Inventors: Amar G. Bose, Wayland; Richard G. Plourde, Ashland, both of MA (US)

(73) Assignee: Bose Corporation, Framingham, MA (US)

(21) Appl. No.: 09/309,257

(22) Filed: May 10, 1999

Related U.S. Patent Documents

Reissue of:
(64) Patent No.: 4,490,843
Issued: Dec. 25, 1984
Appl. No.: 06/388,097
Filed: Jun. 14, 1982

(51) Int. Cl.[7] ..... H03G 9/00
(52) U.S. Cl. ..... 381/102; 381/109; 333/28 T
(58) Field of Search ..... 381/101, 102, 381/103, 104, 109, 120, 119, 98; 333/28 T, 28 R

(56) References Cited

U.S. PATENT DOCUMENTS

| | | | | |
|---|---|---|---|---|
| 31,679 | | 9/1984 | Froeschle et al. | 381/89 |
| 2,144,565 | * | 1/1939 | Dreisbach | 381/104 |
| 2,680,232 | * | 6/1954 | Claras et al. | 333/28 T |
| 2,812,498 | * | 11/1957 | Hall | 333/28 T |
| 2,900,609 | * | 8/1959 | Estkowski | 333/28 T |
| 3,313,865 | * | 4/1967 | Aiken | 381/102 |
| 4,046,960 | * | 9/1977 | Veale | 333/28 T |
| 4,076,959 | * | 2/1978 | Gilbert et al. | 381/101 |
| 4,146,744 | | 3/1979 | Veranth | 179/1 |
| 4,146,745 | | 3/1979 | Froeschle et al. | 179/1 |
| 4,220,817 | * | 9/1980 | Kampmann | 381/101 |
| 4,292,467 | | 9/1981 | Odlen et al. | 179/1 D |
| 5,170,435 | | 12/1992 | Rosen et al. | 381/86 |

OTHER PUBLICATIONS

Newcomb, Jr. et al., "Practical Loudness: An Active Circuit Design Approach", Journal of the Audio Engineering Society, vol. 24, No. 1, pp. 32–35, Jan. 1976.*

AIWA 3–Band Stereo Radio Cassette REcorder Service Manual for Model No. CS–880E,K; pp. 1, 25, 26, and Schematic, Jul. 1981.*

Holman and Kapman, "Loudness Compensation: Use and Abuse", Presented at Audio Engineering Society 58th convention, New York; Audio Engineering Society Preprint No. 1281(D–4), Nov. 1977.*

C.R. Miner, "An Ethical Loudness Control," The Audio Amateur, vol. III, No. 3, Mar. 1973, p. 22.

F. Langford–Smith Radiotron Designer's Handbook–Fourth Edition, 1952.

Llewellyn Bates Keim, "Latest in Triode High Fidelity Amplifiers", Radio & Television News, pp. 42–44, 88 & 90 Feb. 1949.

"2–Speaker Phono", Radio and Television News, page unknown, date unknown.

* cited by examiner

*Primary Examiner*—Forester W. Isen
*Assistant Examiner*—Xu Mei
(74) *Attorney, Agent, or Firm*—Fish & Richardson P.C.

(57) ABSTRACT

An automatic dynamic equalization circuit has a potentiometer having a tap shunted by an active resonator circuit including a capacitor shunted by an active circuit presenting a high Q inductive reactance that is resonant at substantially 50 Hz and provides essentially no boost in the middle range of frequencies above 150 Hz with roll-off below about 45 Hz.

24 Claims, 5 Drawing Sheets

DYNAMIC EQUALIZING

Matter enclosed in heavy brackets [ ] appears in the original patent but forms no part of this reissue specification; matter printed in italics indicates the additions made by reissue.

The present invention relates in general to equalizing and more particularly concerns novel apparatus and techniques for automatically controlling frequency response of a sound amplifying system as a function of level without introducing undesired boominess in voice reproduction. Conventional loudness contours for loudness compensation are described in a paper entitled "Loudness Compensation, Use and Abuse" by Tomlinson Holman & Frank S. Kapmann, Preprint No. 1281(D-4) of a paper presented at the Audio Engineering Society in November 1977. These loudness contour circuits are based upon Fletcher-Munson curves which relate the frequency response of a human to the level of the sound being heard. Humans are less sensitive to bass frequencies relative to other frequencies at lower volume levels than at higher levels. To compensate for this difference many audio amplifying systems include a loudness control that increases the bass and treble boost at lower volume levels.

The above-identified paper and U.S. Pat. No. 4,220,817 describe a bass-control circuit that attempts to match the shape of the Fletcher-Munson curves or those of later researchers. Historically, loudness controls in sound reproduction equipment have been designed so that as the volume control is adjusted, compensating networks change the frequency response of the system in the opposite manner to the way the ear changes its frequency response as the sound level is varied. It has been discovered that this approach leads to some undesirable effects. The present invention yields significantly improved performance.

To understand the problems with the existing loudness controls and how the present invention solves these problems, consider first how the frequency response of the human ear changes with the intensity of the sound presented to it. Then the effects of these changes on voice and music signals will be examined.

Equal-loudness contour curves were measured on subjects by Fletcher and Munson in the U.S.A. and later by Churcher and King in England. These equal-loudness contours show that as the sound level of pure tones presented to the ear is decreased, the ear loses its sensitivity to tones of frequencies below 500 Hz. Thus if an acoustic signal consisting of two pure tones of equal sound pressure level, one at 50 Hz and the other at 1,000 Hz, is experienced first at a high sound pressure level and then at a low pressure sound level, the signal of lower sound pressure level will be perceived to have less of the 50 Hz tone relative to the 1,000 Hz tone than will the signal of higher sound pressure level.

"Loudness" controls in sound reproduction equipment were developed to boost the low frequencies relative to the mid frequencies as the volume control is decreased in order to just compensate for the decreasing sensitivity of the ear to low frequencies as the sound level is decreased. However, boosting the low frequencies in signals reproduced at low sound levels does not restore the perception of the sound to that which could be experienced in a live situation. This is because the live sound, if heard at a low level, would also be subject to the ear's decreased sensitivity at low frequencies and would therefore be perceived to contain less low frequencies relative to the mid frequencies. For this reason loudness controls found on sound reproduction equipment today cause voices to be perceived as vary bass heavy (boomy) when reproduced at low volume levels. This is the reason that hi-fi equipment contains a switch to defeat the loudness control when it is objectionable. Daily, people have occasion to hear the live speech of others at different sound levels. This occurs, for example, with varying distances between the speaker and listener outdoors. It also occurs when people speak with different sound levels at different times. The lower sound levels of live speech are perceived to have less bass, and that is considered natural. It has been discovered that any attempt to restore these low frequencies to the voice in reproducing it at low sound levels is perceived as artificial.

However, experience with live music is generally quite different. Conductors do not play given compositions at, for example, 30 db different sound levels, and sound levels in concert halls do not differ by very large amounts in different seats. Thus in concert hall live performances listeners are accustomed to hearing a given composition at more or less a given sound level. Even with outdoor bands, concentrated listening is associated with a loud level in the immediate proximity of the band. In band music played outdoors without reinforcement one can of course move far enough away from the band to appreciably lower the sound level. However, as one does this, the air attenuates the high frequencies much more than the low frequencies, thus compensating in part for what would otherwise be a perceived loss of low frequencies with large distances.

When recorded music is played back at a sound level lower than that which would be experienced for that composition in a live performance, it is perceived that the bass instrument sounds (for example the double bass, bass drum and organ pedal notes) are virtually missing from the composition because of the decreased sensitivity of the ear to low frequencies. Since this low level listening experience is not (unlike the voice) associated with live performances, it was discovered that properly boosting the very low frequencies (below 200 Hz) restores perception of the bass instruments in a manner that is regarded as an improvement without degrading voice reproduction as do the prior art loudness compensation methods.

It has been discovered that even though the Fletcher-Munson equal-loudness curves predict one should also boost the frequencies between 200 and 500 Hz, very satisfactory musical performance is obtained by limiting the frequencies to be boosted to those below 200 Hz. In this manner the invention avoids the undesirable effects described earlier on the voice because the invention inserts negligible boost at any of the formant frequencies of the voice.

It has also been discovered that even below 200 Hz the optimum boost in frequency response is not, as is commonly believed, predicted by variations in the equal-loudness curves as a function of signal level. The Fletcher-Munson curves were made with pure tones (sine waves). They tell only what sound pressure level a pure tone of some given frequency must have in order to be perceived to be as loud as another pure tone at 1000 Hz of a given sound pressure level.

In music there is no fixed relationship between the amplitude of the low frequency components and those of the middle frequencies (which are largely responsible for establishing the level of loudness perceived from the musical composition) and therefore the volume control setting when reproducing music. The relative amplitudes of different tones depend upon the particular musical composition and vary within any composition.

Furthermore in music it is possible, for example, to have two different instruments, say an organ and a double bass, playing simultaneously in the same low frequency band with different amplitudes. Following the equal-loudness curve, theory of loudness compensation with volume control setting, a different amount of bass boost would be required for each of the instruments for a given decrease in the volume control setting. This, of course, cannot be achieved since the two music signal occupy the same frequency band and cannot be mathematically separated. Thus, it has been discovered that the equal-loudness contour curves are not the proper curves to use in the design of a loudness control.

According to the invention, there has been discovered a family of frequency contours which vary with volume control setting that improve the perceived low level music reproduction and do not degrade voice reproduction.

Accordingly, it is an important object of this invention to provide improved loudness compensation.

It is another object of the invention to provide improved automatic loudness compensation.

It is a further object of the invention to achieve one or more of the preceding objects with automatic loudness compensation that does not introduce undesired boominess in reproduced voices or low frequency music signals.

It is still a further object of the invention to achieve one or more of the preceding objects with circuitry that is reliable and relatively easy and inexpensive to assemble.

According to the invention, means are provided for establishing a loudness compensation curve, which even at the extreme boost positions, provides negligible boost at and above 200 Hz. According to another aspect of the invention, automatic loudness compensation in the low frequency range is provided by circuitry common to both channels of a stereo amplifying system.

Numerous other features, objects and advantages of the invention will become apparent from the following specification when read in connection with the accompanying drawing in which.

Figure 1:
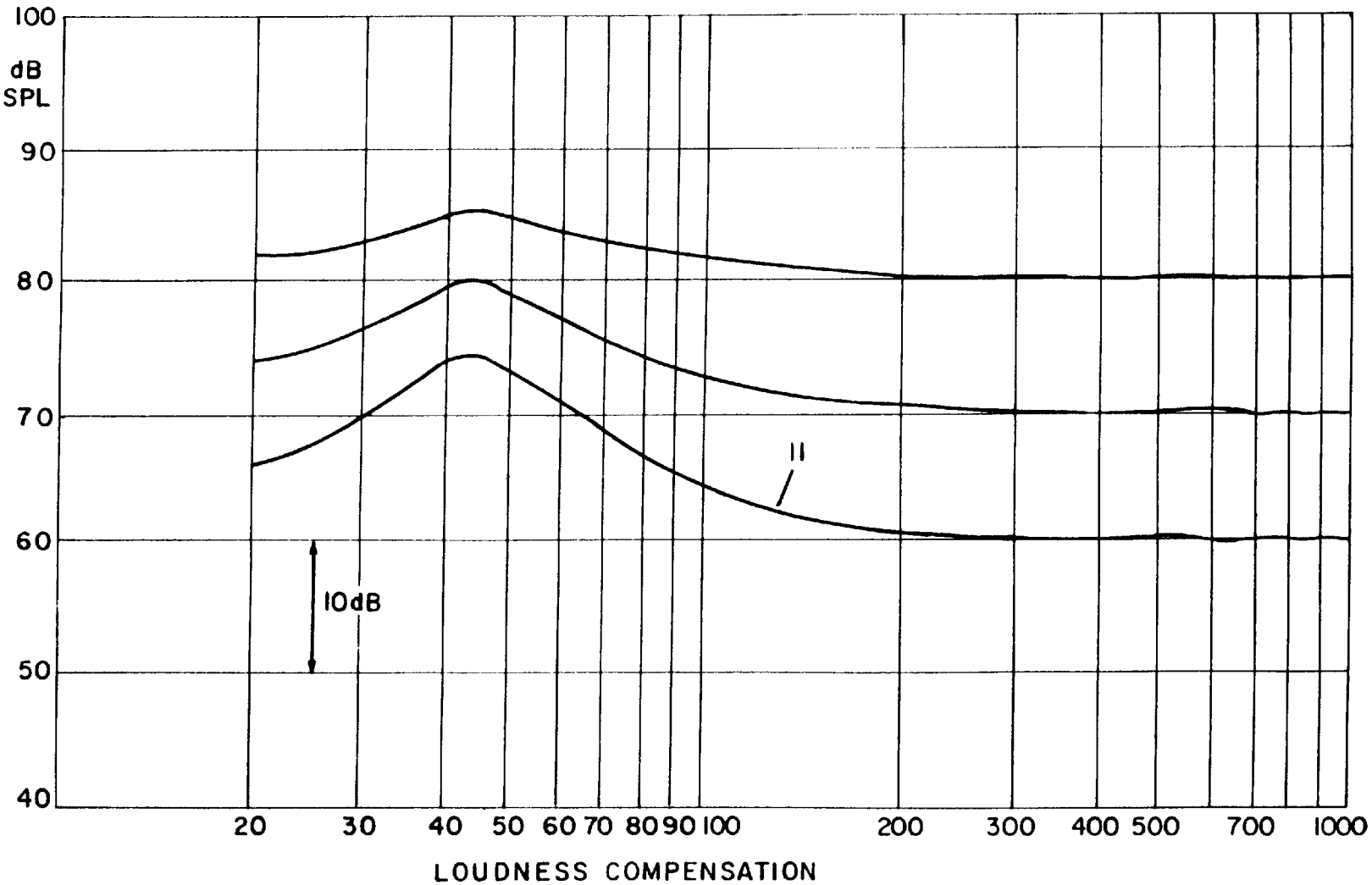
FIG. 1 is a graphical representation of loudness compensation provided according to the invention.

With reference now to the drawing and more particularly FIG. 1 thereof, there is shown a number of loudness compensation curves introduced according to the invention in which even at the extreme boost positions, curve 11 does not provide more than 1.5 db boost at and above 150 Hz with rolloff that helps reduce audible low frequency noise. The present invention overcomes the prior art deficiencies by recognizing that prior art curves have been based upon loudness measurements which do not necessarily relate to the perceived quality of complex signals.

Figure 2:
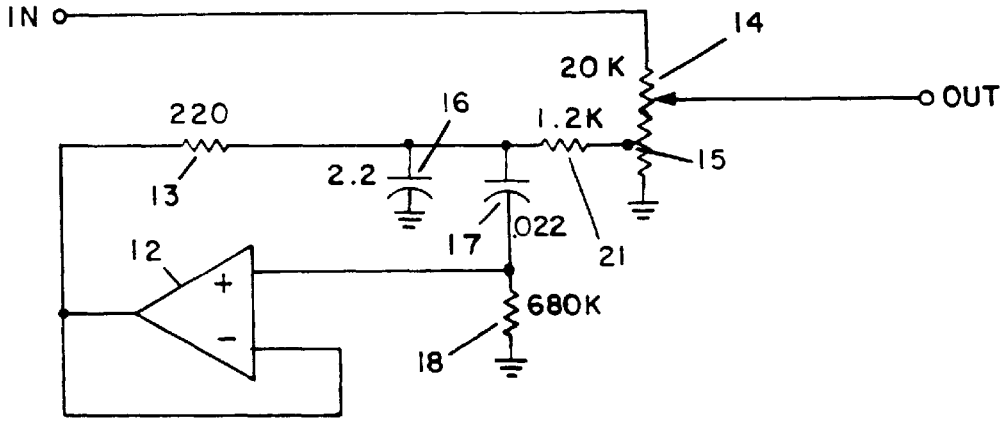
FIG. 2 is a schematic circuit diagram of one form of compensation circuitry according to the invention.

Referring to FIG. 2, there is shown an embodiment of a circuit for producing automatic loudness compensation characterized by the response of FIG. 1. A feature of the invention is the use of an active resonant circuit to establish Q high enough to insure adequate bass boost in the desired bass region of 40 Hz to 60 Hz while maintaining approximately flat response above 150 Hz.

A volume control 14 has a tap 15 connected to it at an appropriate point to achieve the loudness boost and the right output levels. For a selected control taper the tap location is chosen such that the tap is located at the point of rotation anticipated as providing a sound pressure level on loudest program material in the listening space of approximately 80 db above $2\times10^{-5}$ N/M$^2$, with resistor 21 connected effectively to ground. With resistor 21 effectively disconnected, the anticipated sound pressure would increase approximately 5 db. This tap is connected to an active resonant circuit comprising tuning capacitor 16 and an active inductor comprising capacitors 17 and resistor 18 driving amplifier 12 which supplies current to the tuning capacitor 16 through resistor 13. This circuitry presents an impedance across capacitor 16 having the current-voltage phase relationship of an inductor and with capacitor 16 behaves as a band-pass filter. This active resonant circuit loads tap 15 at all frequencies except the resonant frequency, typically set to 50 Hz. At the resonant frequency the impedance of the active network becomes high, and the tap is no longer loaded through the 1.2K resistor 21 so that the output of the network increases.

Figure 3:
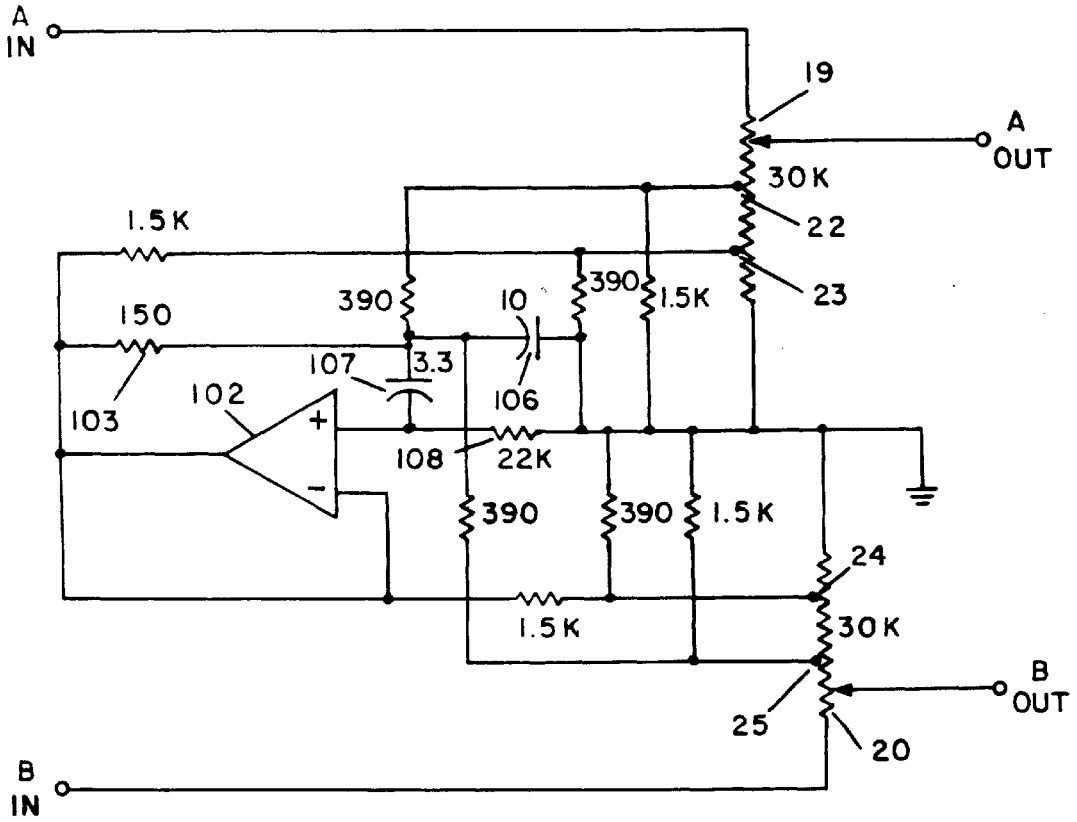
FIG. 3 is a schematic circuit diagram of automatic loudness compensation according to the invention suitable for use in a multichannel system.

Referring to FIG. 3, there is shown another embodiment of the invention. It has been discovered that maintaining good separation at low frequencies as volume decreases is not necessary. It is thus practical to use a single active resonant circuit of the type shown in FIG. 2 for a multichannel system. The two channels designated A and B may be controlled by a ganged potentiometer having elements 19 and 20. The active resonator is connected to taps 22 and 23 on potentiometer 19 and taps 24 and 25 on potentiometer 20 to achieve the desired loudness compensation curve shown in FIG. 1. Since the resonant network presents essentially a short to ground at high frequencies, there is no cross coupling between the channels at high frequencies, and the separation between channels remains good. Only at the bass frequencies where the loudness compensation is desired does the impedance at the terminal of tuning capacitor 107 increase to the point where there is coupling between channels. At these low frequencies the separation of the circuit decreases, but this decrease does not result in acoustically objectionable phenomena because higher frequency spectral components in the A and B channels provide adequate perceived stereo separation at lower volumes. FIG. 3 also discloses a preferred form of the invention employing more than one tap on the volume control potentiometers 19 and 20 with different signals fed into each tap to more precisely tailor the loudness contour to the desired characteristic shown in FIG. 1. By employing still more taps it is possible to more precisely achieve the desired curve.

The additional taps are used to reinject the band-pass filtered signal so as to more nearly approximate the desired behavior of 10 db relative bass boost for each 20 db of midband attenuation in a smooth and continuous manner. The 390 ohm and 1.5K ohm resistors along with the specified taper of the control establish the desired attenuation of the control with the wiper located at the lower tap as being 30 db more or less greater than the attenuation at the upper tap, while the 1.5K ohm resistor, in conjunction with the gain of the filter circuit and the voltage divider action of the potentiometer and the 390 ohm resistor, establishes the reinjected bass signal level.

Figure 4:
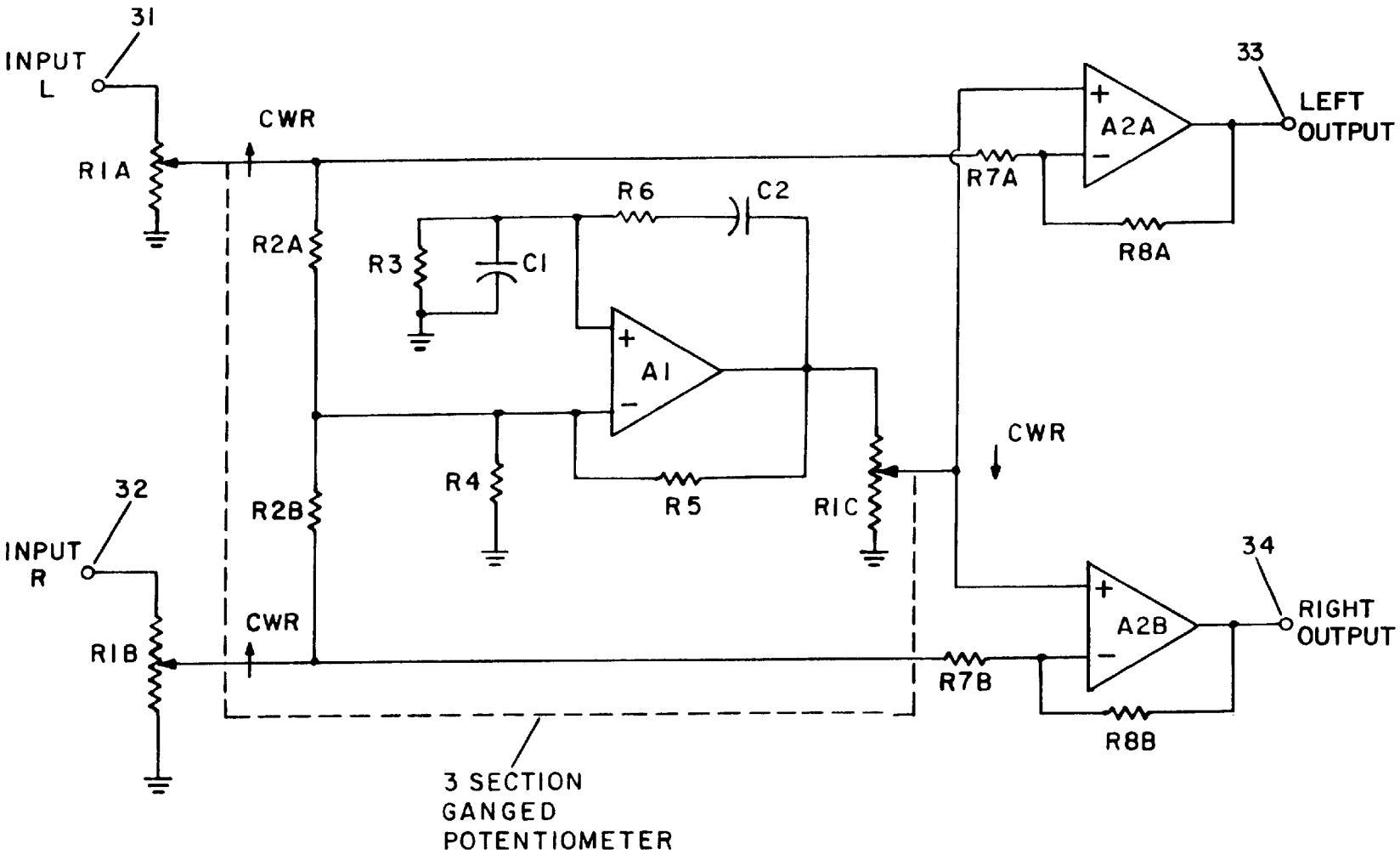
FIG. 4 is a schematic circuit diagram of an alternate embodiment of the invention for use in a multiple channel system.

Referring to FIG. 4, there is shown an alternate embodiment of the invention to use in a stereo system. Left and right channel input signals applied to input terminals 31 and 32 are processed to provide left and right channel signals with loudness compensation on output terminals 33 and 34. Potentiometers R1A, R1B and R1C comprise a ganged three-section potentiometer in a system having common bass boost. Potentiometer sections R1A and R1B provide a desired audio taper with the wiper the parallel combinations of resistors R2A, R7A and R2B, R7B, respectively. Differential amplifiers A2A and A2B receive the full bandwidth signals through input resistors R7A and R7B, respectively, and each comprises means for differentially combining this full bandwidth signal with the bandlimited signal provided on the wiper arm of potentiometer section R1C. Resistors R2A and R2B also deliver these signals to a filter circuit comprising amplifier A1 and associated circuit components having a bandpass characteristic typically centered at about 50 Hz. This center frequency is preferably near the low frequency cutoff of the associated sound reproduction system. Potentiometer section R1C receives the filtered signal at the output of amplifier A1 and has a taper such that for settings of the gain control anticipated as resulting in peak sound levels greater than 90 db SPL in the listening space, the wiper arm of this potentiometer section is effectively grounded, while for each 10 db additional attenuation imparted by potentiometer sections R1A and R1B, the attenuation imparted by potentiometer section R1C is reduced, resulting in an increase of 5 db at the output of amplifiers A2A and A2B at the bandpass filter center frequency compared to the midfrequency output at the same point, thereby providing the desired loudness compensation without affecting the gain in the middle range of frequencies above 200 Hz.

In the specific circuit illustrated in FIG. 4, the components designated by an appended A or B have substantially the same parameter values. If it is desired to have separate bass boost loudness circuits for each channel, the filter circuitry comprising amplifier A1 and associated components may be duplicated.

Figure 5:
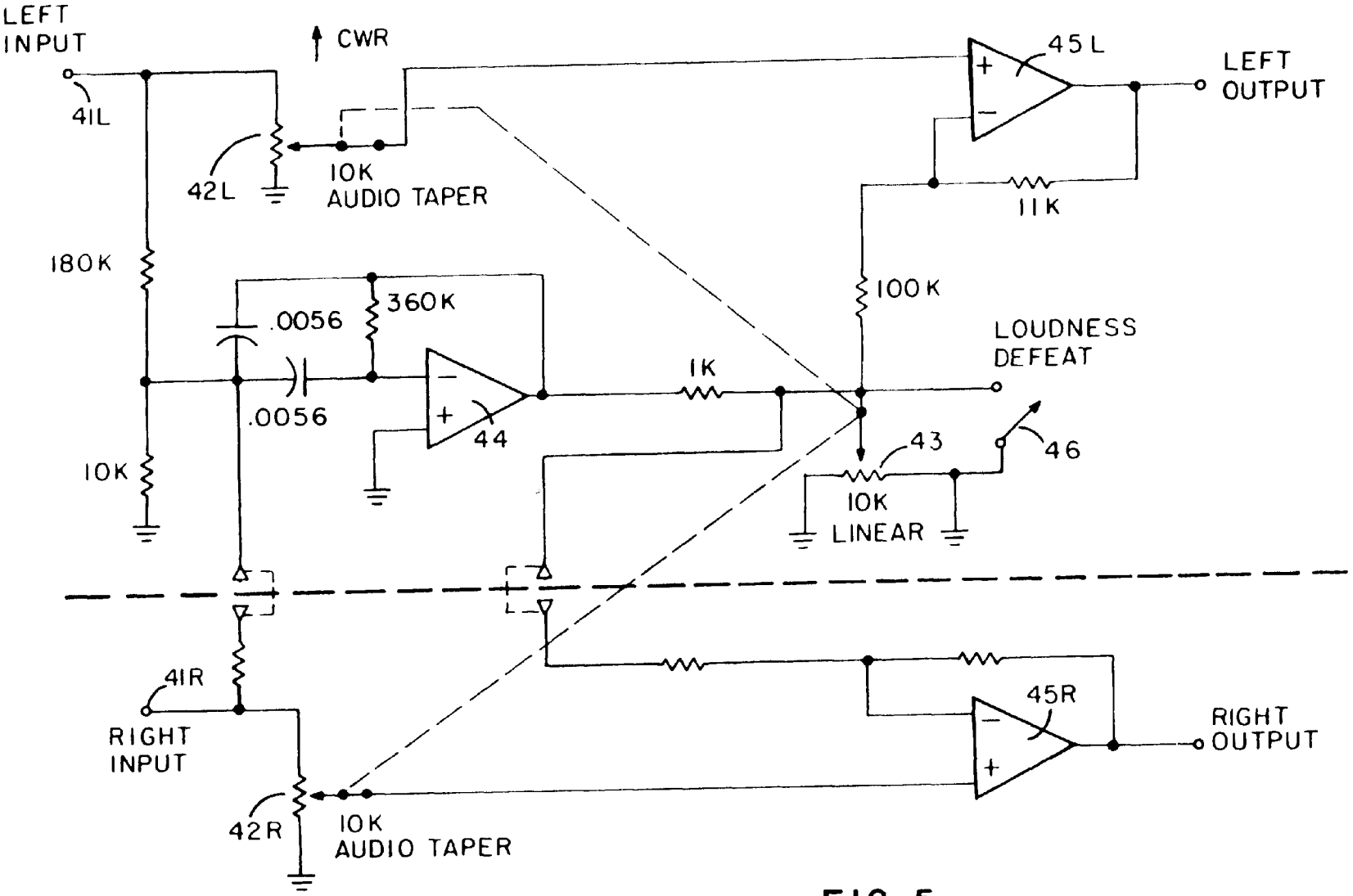
FIG. 5 is a schematic diagram of a preferred form of the invention.

Referring to FIG. 5, there is shown a schematic diagram of another form of the invention that also uses a ganged three-section potentiometer. Like elements in left and right channels are designated by the same reference numeral with L and R appended to designate left and right channels respectively. Input potentiometers 42L and 42R are mechanically ganged with common potentiometer 43. Low frequencies are amplified by amplifier 44 and associated circuit components. Amplifiers 45L and 45R amplify high frequency components. A normally open dynamic equalization defeat switch 46 grounds the arm of potentiometer 43 to defeat dynamic equalization.

This circuit has a number of advantages as compared with circuitry using a tapped potentiometer. Component values in the filter circuit may be set independently of volume control resistance. Large expensive bulky capacitors are not needed. Relative gain between channels (gain control tracking) is improved by eliminating errors in potentiometer manufacture related to repeatability of mechanical location of taps relative to control shaft position and tap loading errors caused by parasitic and nonrepeatable tap connection resistance. The circuit is not dependent on a low source resistance in the prior stage for proper operation. The circuit may be implemented with readily available components. Note that linear potentiometer 43 is grounded at both ends, and the signal is both introduced and taken from the arm.

Figure 6:
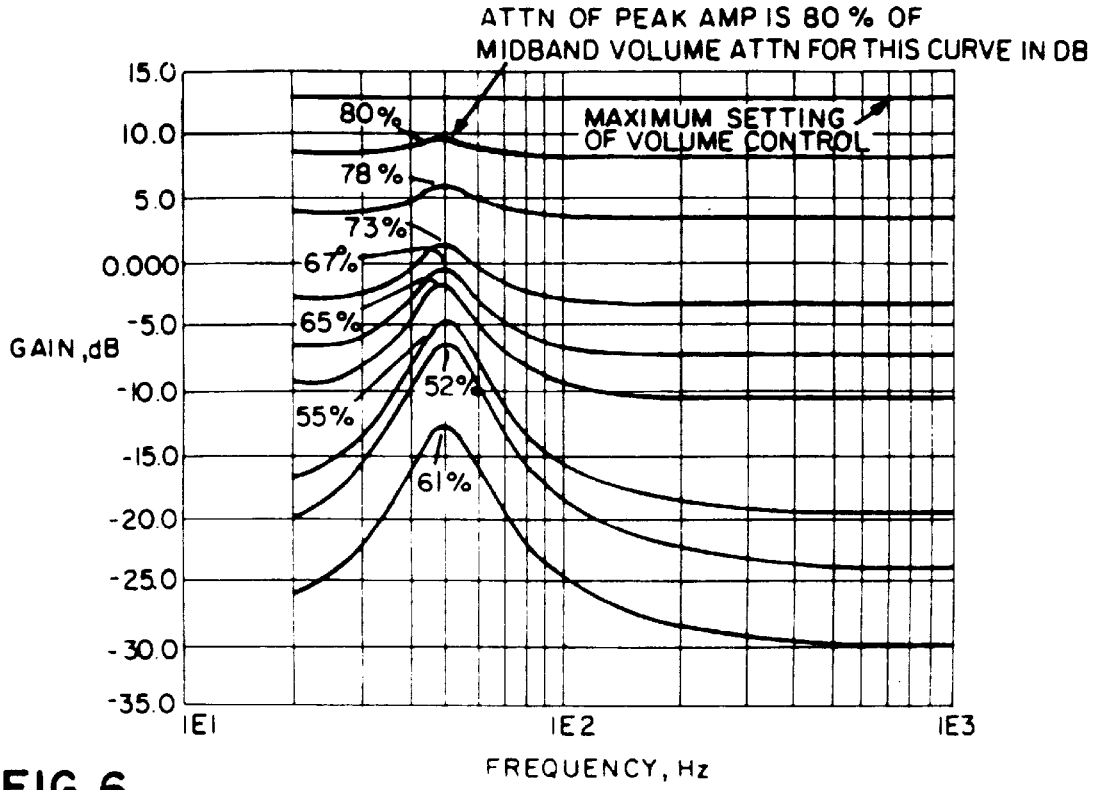
FIG. 6 is a graphical representation of loudness compensation according to the invention for a range of volume settings.

Referring to FIG. 6, there is shown a graphical representation of equalization introduced for different volume control settings, the frequency being designated on a log scale from 10 to 1000 Hz with the number after E designating the exponent of 10 multiplying the digit 1 before E. The response is flat for maximum volume control setting and departs from flatness as the volume control setting decreases as shown in the example of FIG. 6.

There has been described discoveries resulting in novel apparatus and techniques for improving automatic loudness compensation. It is evident that those skilled in the art may now make numerous modifications of and departures from the specific apparatus and techniques disclosed herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

[1. In automatic dynamic equalization circuitry having a manually operated variable resistance gain control and means for varying the bass boost in amplitude imparted to spectral components at bass frequencies relative to the amplitude of spectral components at midband frequencies as a function of the manually controlled gain imparted to an audio signal being processed for reproduction as audible sound at midband frequencies, the improvement comprising, means including said gain control for imparting negligible boost to voice formant spectral components at frequencies in the middle range of frequencies beginning at 200 Hz for different manually controlled gains imparted to said audio signal as determined by the manual setting of said gain control while significantly changing said bass boost in the bass frequency region therebelow as a function of said gains so that at low listening reproduced sound levels of said audio signal, reproduced bass spectral components are perceived by listeners without degrading reproduced voices when characterized by said audio signal.]

2. [The improvement in accordance with claim 1] *In automatic dynamic equalization circuitry having a manually operated variable resistance gain control and means for varying the bass boost in amplitude imparted to spectral components at bass frequencies relative to the amplitude of spectral components at midband frequencies as a function of the manually controlled gain imparted to an audio signal being processed for reproduction as audible sound at midband frequencies, the improvement comprising,*

*means including said gain control for imparting negligible boost to voice formant spectral components at frequencies in the middle range of frequencies beginning at 200 Hz for different manually controlled gains imparted to said audio signal as determined by the manual setting of said gain control while significantly changing said bass boost in the bass frequency region therebelow as a function of said gains so that at low listening reproduced sound levels of said audio signal, reproduced bass spectral components are perceived by listeners without degrading reproduced voices when characterized by said audio signal,* wherein said means comprises a tapped potentiometer shunted by a resonant circuit having a resonance in the bass frequency range significantly below 150 Hz.

3. The improvement in accordance with claim 2 wherein said resonant circuit is characterized by high Q and comprises a capacitor shunted by an active circuit presenting an inductive reactance.

4. The improvement in accordance with claim 3 and further comprising, a second potentiometer ganged with said first-mentioned potentiometer and associated with a second channel.

5. The improvement in accordance with claim 2 and further comprising, a second tap on said potentiometer shunted by an active resonant circuit.

6. [The improvement in accordance with claim 1] *In automatic dynamic equalization circuitry having a manually operated variable resistance gain control and means for varying the bass boost in amplitude imparted to spectral components at bass frequencies relative to the amplitude of spectral components at midband frequencies as a function of the manually controlled gain imparted to an audio signal being processed for reproduction as audible sound at midband frequencies, the improvement comprising,*

*means including said gain control for imparting negligible boost to voice formant spectral components at frequencies in the middle range of frequencies beginning at 200 Hz for different manually controlled gains imparted to said audio signal as determined by the manual setting of said gain control while significantly changing said bass boost in the bass frequency region therebelow as a function of said gains so that at low listening reproduced sound levels of said audio signal, reproduced bass spectral components are perceived by listeners without degrading reproduced voices when characterized by said audio signal,* wherein said means comprises, input potentiometer means ganged with output potentiometer means, means for differentially combining a signal corresponding to the signal on the arm of said input potentiometer means with a signal corresponding to that on the arm of said output potentiometer means to provide an output signal with loudness compensation, and bandpass filter means intercoupling said input potentiometer arm and said output potentiometer means for selectively transmitting a band of spectral components centered substantially at least as low as 70 Hz and below said middle range of frequencies.

7. The improvement in accordance with claim 6 and further comprising a second of said input potentiometer means ganged with said first input potentiometer means and said output potentiometer means, and second means for differentially combining the signal corresponding to that on said output potentiometer arm with a signal corresponding to the signal on the arm of said second input potentiometer means.

8. The improvement in accordance with claim 6 wherein said potentiometer means are characterized by tapers and comprise means for establishing the attenuation imparted by said output potentiometer means reduced for 10 db attenuation introduced by said input potentiometer means from a predetermined reference level to result in an increase of substantially 5 db at the output of said means for differentially combining at said bandpass filter center frequency relative to the midfrequency output thereat.

9. [The improvement in accordance with claim 1] *In automatic dynamic equalization circuitry having a manually operated variable resistance gain control and means for varying the bass boost in amplitude imparted to spectral components at bass frequencies relative to the amplitude of spectral components at midband frequencies as a function of the manually controlled gain imparted to an audio signal being processed for reproduction as audible sound at midband frequencies, the improvement comprising,*

*means including said gain control for imparting negligible boost to voice formant spectral components at frequencies in the middle range of frequencies beginning at 200 Hz for different manually controlled gains imparted to said audio signal as determined by the manual setting of said gain control while significantly changing said bass boost in the bass frequency region therebelow as a function of said gains so that at low listening reproduced sound levels of said audio signal, reproduced bass spectral components are perceived by listeners without degrading reproduced voices when characterized by said audio signal,* wherein said means for imparting includes means for rolling off the frequency response below a predetermined bass frequency below 70 Hz.

10. The improvement in accordance with claim 9 wherein said means comprises a tapped potentiometer shunted by a resonant circuit having a resonance in the bass frequency range significantly below 150 Hz.

[11. The improvement in accordance with claim 1 wherein said means for varying the boost comprises a volume control and is characterized by a frequency response dependent upon the volume control setting for boosting low frequencies as the volume control setting is decreased while maintaining substantially uniform frequency response for all format frequencies of the human voice.]

[12. The improvement in accordance with claim 11 wherein said means for varying the boost provides negligible boost above 100 Hz for volume control attenuations of less than 20 db.]

[13. The improvement of claim 11 wherein said means for varying the boost provides negligible boost above 200 Hz for volume control attenuations between 20 and 40 db.]

14. [The improvement in accordance with claim 11] *In automatic dynamic equalization circuitry having a manually operated variable resistance gain control and means for varying the bass boost in amplitude imparted to spectral components at bass frequencies relative to the amplitude of spectral components at midband frequencies as a function of the manually controlled gain imparted to an audio signal being processed for reproduction as audible sound at midband frequencies, the improvement comprising,*

*means including said gain control for imparting negligible boost to voice formant spectral components at frequencies in the middle range of frequencies beginning at 200 Hz for different manually controlled gains imparted to said audio signal as determined by the manual setting of said gain control while significantly changing said bass boost in the bass frequency region therebelow as a function of said gains so that at low listening reproduced sound levels of said audio signal, reproduced bass spectral components are perceived by listeners without degrading reproduced voices when characterized by said audio signal,*

*wherein said means for varying the boost comprises a volume control and is characterized by a frequency response dependent upon the volume control setting for boosting low frequencies as the volume control setting is decreased while maintaining substantially uniform frequency response for all format frequencies of the human voice,* wherein the magnitude of the slope of the equalization contour is greater than 12 db/octave for at least some of the lower volume control settings.

15. [The improvement in accordance with claim 11] *In automatic dynamic equalization circuitry having a manually operated variable resistance gain control and means for varying the bass boost in amplitude imparted to spectral components at bass frequencies relative to the amplitude of spectral components at midband frequencies as a function of the manually controlled gain imparted to an audio signal being processed for reproduction as audible sound at midband frequencies, the improvement comprising,*

*means including said gain control for imparting negligible boost to voice formant spectral components at*

*frequencies in the middle range of frequencies beginning at 200 Hz for different manually controlled gains imparted to said audio signal as determined by the manual setting of said gain control while significantly changing said bass boost in the bass frequency region therebelow as a function of said gains so that at low listening reproduced sound levels of said audio signal, reproduced bass spectral components are perceived by listeners without degrading reproduced voices when characterized by said audio signal,*

*wherein said means for varying the boost comprises a volume control and is characterized by a frequency response dependent upon the volume control setting for boosting low frequencies as the volume control setting is decreased while maintaining substantially uniform frequency response for all format frequencies of the human voice,* wherein said means for varying comprises circuit means characterized by complex poles which move closer to the imaginary axis as the volume control setting is decreased.

16. [The improvement in accordance with claim 11] *In automatic dynamic equalization circuitry having a manually operated variable resistance gain control and means for varying the bass boost in amplitude imparted to spectral components at bass frequencies relative to the amplitude of spectral components at midband frequencies as a function of the manually controlled gain imparted to an audio signal being processed for reproduction as audible sound at midband frequencies, the improvement comprising,*

*means including said gain control for imparting negligible boost to voice formant spectral components at frequencies in the middle range of frequencies beginning at 200 Hz for different manually controlled gains imparted to said audio signal as determined by the manual setting of said gain control while significantly changing said bass boost in the bass frequency region therebelow as a function of said gains so that at low listening reproduced sound levels of said audio signal, reproduced bass spectral components are perceived by listeners without degrading reproduced voices when characterized by said audio signal,*

*wherein said means for varying the boost comprises a volume control and is characterized by a frequency response dependent upon the volume control setting for boosting low frequencies as the volume control setting is decreased while maintaining substantially uniform frequency response for all format frequencies of the human voice,* and further comprising means for establishing roll off of the frequency response below a predetermined low bass frequency significantly below 100 Hz.

17. The improvement in accordance with claim 16 wherein the slope of said roll off increases as the volume control setting is decreased.

18. [The improvement in accordance with claim 11] *In automatic dynamic equalization circuitry having a manually operated variable resistance gain control and means for varying the bass boost in amplitude imparted to spectral components at bass frequencies relative to the amplitude of spectral components at midband frequencies as a function of the manually controlled gain imparted to an audio signal being processed for reproduction as audible sound at midband frequencies, the improvement comprising,*

*means including said gain control for imparting negligible boost to voice formant spectral components at frequencies in the middle range of frequencies beginning at 200 Hz for different manually controlled gains imparted to said audio signal as determined by the manual setting of said gain control while significantly changing said bass boost in the bass frequency region therebelow as a function of said gains so that at low listening reproduced sound levels of said audio signal, reproduced bass spectral components are perceived by listeners without degrading reproduced voices when characterized by said audio signal,*

*wherein said means for varying the boost comprises a volume control and is characterized by a frequency response dependent upon the volume control setting for boosting low frequencies as the volume control setting is decreased while maintaining substantially uniform frequency response for all format frequencies of the human voice,* and further comprising fixed equalization circuit means coacting therewith for providing a predetermined desired frequency response at the maximum setting of said volume control.

19. [The improvement in accordance with claim 11] *In automatic dynamic equalization circuitry having a manually operated variable resistance gain control and means for varying the bass boost in amplitude imparted to spectral components at bass frequencies relative to the amplitude of spectral components at midband frequencies as a function of the manually controlled gain imparted to an audio signal being processed for reproduction as audible sound at midband frequencies, the improvement comprising,*

*means including said gain control for imparting negligible boost to voice formant spectral components at frequencies in the middle range of frequencies beginning at 200 Hz for different manually controlled gains imparted to said audio signal as determined by the manual setting of said gain control while significantly changing said bass boost in the bass frequency region therebelow as a function of said gains so that at low listening reproduced sound levels of said audio signal, reproduced bass spectral components are perceived by listeners without degrading reproduced voices when characterized by said audio signal,*

*wherein said means for varying the boost comprises a volume control and is characterized by a frequency response dependent upon the volume control setting for boosting low frequencies as the volume control setting is decreased while maintaining substantially uniform frequency response for all format frequencies of the human voice;*

*the improvement* characterized by a family of dynamic equalization curves centered about a frequency of peak amplitude with the amplitude response at the latter frequency decreasing in the range of approximately 80% to 40% of the overall attenuation introduced by the volume control setting over a volume control attenuation range of the order of 15 db.

*20. The improvement according to claim 9 wherein the function for significantly changing said bass boost changes said base boost in a smooth and continuous manner.*

*21. The improvement according to claim 20 wherein the means for imparting comprises a potentiometer for the manual setting of said gain control.*

*22. The improvement according to claim 21 wherein the potentiometer produces an analog output.*

*23. The improvement according to claim 21 further comprising an active resonant circuit connected directly to the potentiometer.*

*24. The improvement according to claim 23 wherein the active resonant circuit is comprised of analog circuitry.*

*25. The improvement according to claim 9 wherein the gain control produces a frequency response characteristic at different manually controlled gains is other than directly related to the Fletcher-Munson curves.*

*26. The improvement according to claim 25 wherein the the gain control produces different frequency response characteristics for at least three different manually controlled gain settings.*

*27. The improvement according to claim 26 wherein the gain control produces maximum bass boost at manually controlled gains below 70 dB SPL.*

*28. The improvement according to claim 16 wherein the frequency response dependent upon the volume control setting is other than directly related to the Fletcher-Munson curves.*

* * * * *